United States Patent
Ito et al.

(10) Patent No.: US 8,766,728 B2
(45) Date of Patent: Jul. 1, 2014

(54) TRANS-IMPEDANCE AMPLIFIER WITH ENHANCED DYNAMIC RANGE BUT INVARIABLE INPUT IMPEDANCE

(71) Applicant: Sumitomo Electric Industries, Ltd., Osaka (JP)

(72) Inventors: Makoto Ito, Yokohama (JP); Yoshiyuki Sugimoto, Yokohama (JP); Keiji Tanaka, Yokohama (JP)

(73) Assignee: Sumitomo Electric Industries, Ltd, Osaka (JP)

( * ) Notice: Subject to any disclaimer, the term of this patent is extended or adjusted under 35 U.S.C. 154(b) by 1 day.

(21) Appl. No.: 13/684,764

(22) Filed: Nov. 26, 2012

(65) Prior Publication Data
US 2013/0135054 A1  May 30, 2013

(30) Foreign Application Priority Data
Nov. 28, 2011 (JP) ................................ 2011-259155

(51) Int. Cl.
*H03F 3/08* (2006.01)

(52) U.S. Cl.
USPC .............................. 330/308; 330/278; 330/85

(58) Field of Classification Search
USPC .......................................... 330/308, 278, 85
See application file for complete search history.

(56) References Cited

U.S. PATENT DOCUMENTS

| | | | | |
|---|---|---|---|---|
| 4,870,369 A * | 9/1989 | Bartenstein et al. | ............ | 330/59 |
| 5,254,851 A | 10/1993 | Yamakawa et al. | | |
| 5,602,510 A * | 2/1997 | Bayruns et al. | ................ | 330/282 |
| 6,292,052 B1 * | 9/2001 | Carlson | ............................. | 330/9 |
| 6,404,281 B1 * | 6/2002 | Kobayashi | ....................... | 330/85 |
| 6,583,671 B2 * | 6/2003 | Chatwin | ........................ | 330/279 |
| 7,671,680 B2 * | 3/2010 | Hara | .............................. | 330/281 |

FOREIGN PATENT DOCUMENTS

| | | |
|---|---|---|
| JP | 4-225630 A | 8/1992 |
| JP | 9-260960 A | 10/1997 |
| JP | 2007-36329 A | 2/2007 |
| JP | 2010-136169 A | 6/2010 |

* cited by examiner

*Primary Examiner* — Patricia Nguyen
(74) *Attorney, Agent, or Firm* — Smith, Gambrell & Russell, LLP

(57) ABSTRACT

A trans-impedance amplifier (TIA) for an optical receiver is disclosed, in which the TIA enhances the dynamic range thereof but suppresses the variation of the input impedance thereof. The TIA enhances the dynamic range by subtracting from the photocurrent input therein, which varies the input impedance. The TIA also provides the variable gain amplifier with a feedback resistor. The variable gain of the amplifier compensates the variation of the input impedance due to the current subtraction.

6 Claims, 9 Drawing Sheets

Pin = +4 dBm

Pin = 0 dBm

_US 8,766,728 B2_

TRANS-IMPEDANCE AMPLIFIER WITH ENHANCED DYNAMIC RANGE BUT INVARIABLE INPUT IMPEDANCE

TECHNICAL FIELD

Embodiments of the present application relate to a trans-impedance amplifier (hereafter denoted simply as TIA), and, in particular, relate to a TIA applied to an optical receiver.

BACKGROUND

Various TIAs usable for the optical communication system as an optical receiver have been known. For instance, Japanese patent applications published as JP-H09-260960, JP-2007-036329A, JP-H04-225630A, and JP 2010-136169A have disclosed a various types of TIAs. Among them, some TIAs have a function to enhance the dynamic range thereof.

SUMMARY

An aspect of the present application relates to a TIA that comprises a current subtracter, and a variable gain amplifier with a feedback resistor connected between an input and an output of the variable gain amplifier. The variable gain amplifier converts a portion of the photocurrent into a voltage output. The current subtracter generates a subtraction current which is subtracted from the photocurrent to generate the portion of the photocurrent input to the variable gain amplifier. A feature of the TIA according to embodiments of the invention is that the subtraction current nonlinearly depends on a magnitude of the output voltage, and the variable gain amplifier also nonlinearly varies the voltage gain thereof. Accordingly, the reduction of the input impedance of the TIA is compensated by the reduction of the gain of the variable gain amplifier.

BRIEF DESCRIPTION OF THE DRAWINGS

The foregoing and other purposes, aspects and advantages will be better understood from the following detailed description of a preferred embodiment of the invention with reference to the drawings, in which:

FIGS. 9A and 9B show the eye diagrams of the output of the TIA without the function to suppress the input impedance, where FIG. 9A corresponds to optical input power of 0 dBm, while, FIG. 9B shows that for optical input power of +4 dBm.

DETAILED DESCRIPTION

Next, some preferred embodiments according to the present invention will be described as referring to drawings.

In the description of the drawings, the numerals or symbols same or similar to each other will refer to the elements same or similar to each other without overlapping explanations.

Figure 7:
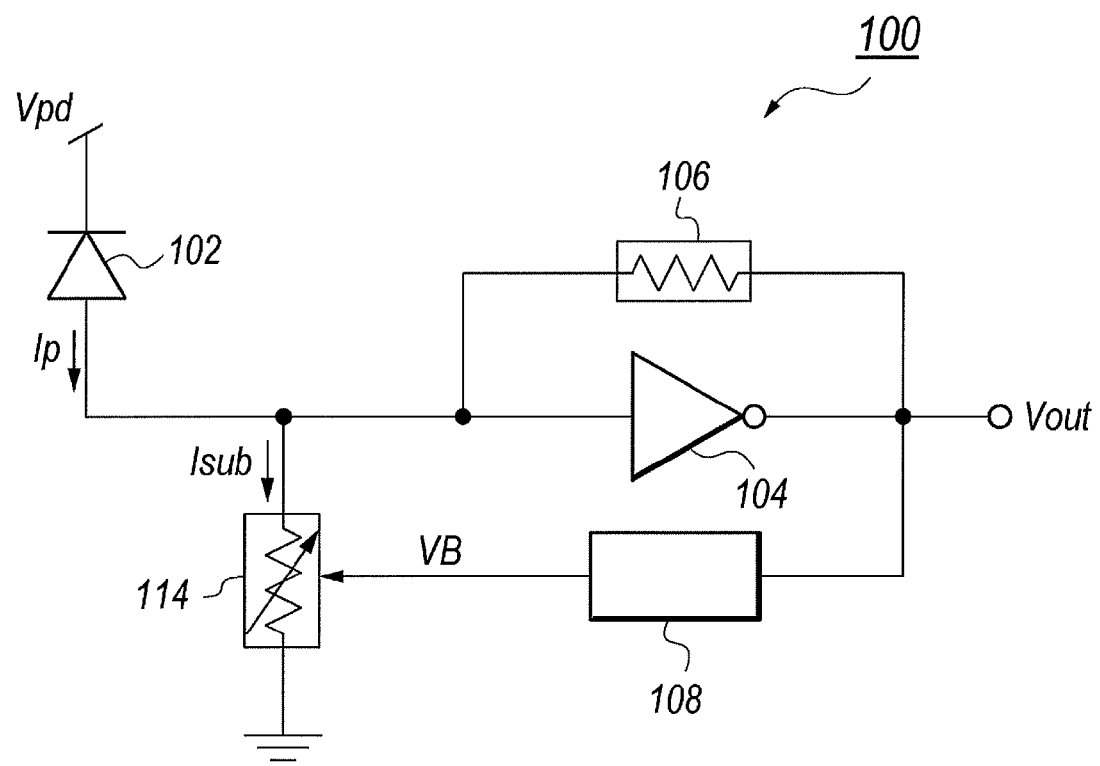
FIG. 7 is a functional block diagram of a TIA with a function to enhance the dynamic range for the photocurrent.

A TIA implemented within an optical receiver requires a wide dynamic range to follow a large variation in the magnitude of the optical signal received thereby. FIG. 7 is a functional block diagram of a TIA with a typical arrangement to satisfy such a request in the optical receiver to enhance the input dynamic range. TIA 100 in FIG. 7, which outputs a voltage signal Vout corresponding to a photocurrent Ip generated in a photodiode (PD) 102, includes an inverting amplifier 104 and a feedback resistor 106. The inverting amplifier 104 is coupled with the anode of the PD 102, while, the output of the amplifier 104 is coupled with the output terminal of the TIA 100. The feedback resistor 106 is put between the input and the output of the inverting amplifier 104.

The TIA 100 shown in FIG. 7 further provides a feedback unit 108 and a variable resistor 114. The variable resistor 114, which is also connected to the anode of the PD 102, subtracts current Isub inversely proportional to the resistance thereof from the photocurrent Ip. The feedback unit 108 adjusts the resistance of the variable resistor 114 by providing a control signal VB thereto based on the voltage level of the voltage output Vout of TIA 100.

Increasing the photocurrent Ip by strengthening the optical magnitude, the feedback unit 108 generates the control signal VB to decrease the resistance of the variable resistor 114. The subtracted current Isub increases and the current input to the inverting amplifier 104 and the feedback resistor 106 decreases, which decreases the voltage output Vout of TIA 100. Thus, TIA 100 decreases the output Vout thereof as the input optical signal increases, which enhances the dynamic range of TIA 100.

However, TIA 100 shown in FIG. 7 has an inherent subject of varying the input impedance thereof, that is, the feedback unit 108 decreases the resistance/impedance of the variable resistor 114, which means that the input impedance of TIA 100 also decreases. The input impedance Zin of TIA 100 is denoted as:

$$\text{Zin} = \{Zf/(A+1)\}//\text{Zsub}, \quad (1)$$

where the symbol "//" means that two elements, e1 and e2, putting this symbol therebetween are connected in parallel, and the resultant resistance/impedance Z is given by $1/Z = (1/e1 + 1/e2)$, namely, $Z = e1 \cdot e2/(e1+e2)$.

According to equation (1), the input impedance Zin behaves as following the change of the resistance/impedance of the variable resistor 114 assuming the gain A of the amplifier to be substantially constant. That is, when the photocurrent Ip increases, which reduces the resistance/impedance of the variable resistor 114, the input impedance Zin also reduces.

The reduction of the input impedance Zin of the amplifier influences the frequency response thereof. The equation (2) below denote the theoretical bandwidth $BW_{3\,dB}$ of an amplifier with the input impedance of Zin measured at a point at which the gain thereof reduces by 3 dB from that of low frequencies:

$$BW_{3\,dB} = (1/2\pi) \cdot (1/\text{Zin}/C_T), \quad (2)$$

where $C_T$ is a sum of capacitance caused between the anode and the cathode of the PD 102 and that caused in the input terminal of TIA 100. Thus, the frequency bandwidth of TIA 100 depends on the input impedance Zin thereof, namely, the resistance/impedance of the variable resistor 114 and the gain of the inverting amplifier 104

Figure 8:
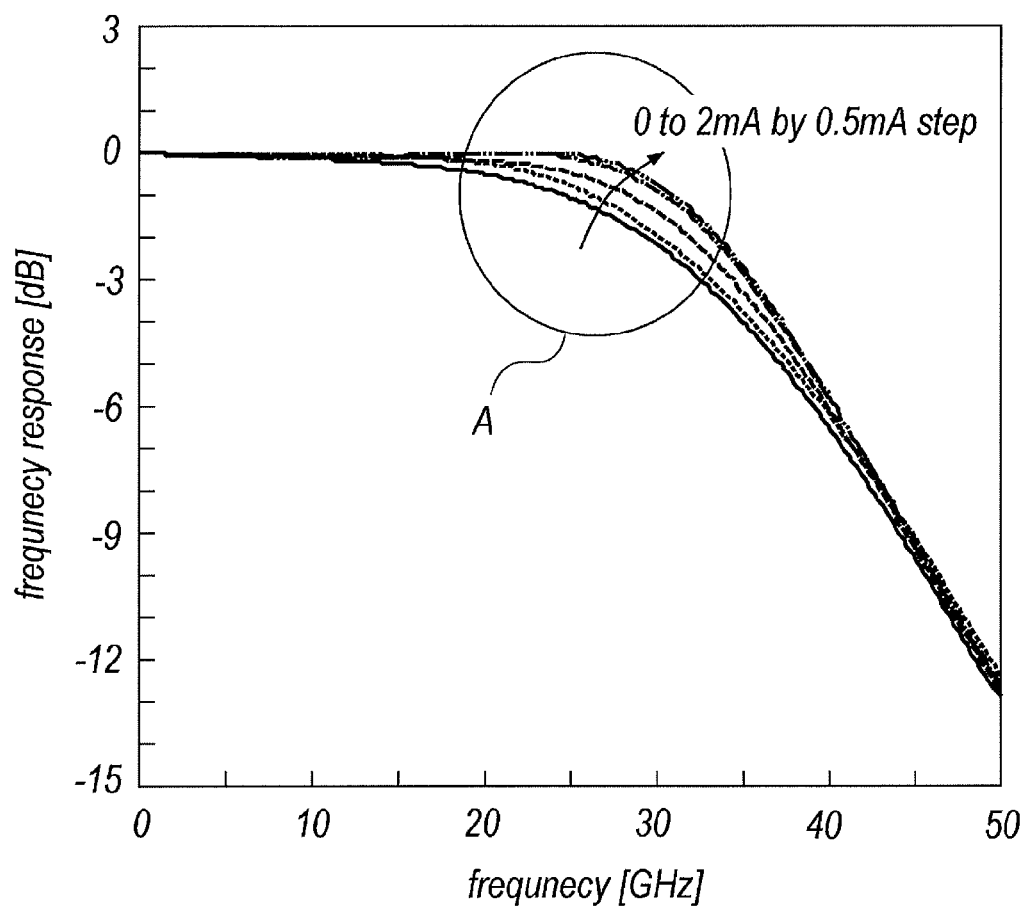
FIG. 8 shows the frequency responses of the TIA shown in FIG. 7 against the input current.

FIG. 8 shows frequency responses of TIA 100 when the photocurrent Ip increases from 0 mA to 2.0 mA by a step of 0.5 mA. Increasing the photocurrent Ip, the resistance/impedance of the variable resistor 114 changes, which also varies the input impedance Zin of the TIA 100, and the frequency response of TIA 100 varies depending on the photocurrent Ip, as shown in an area A in FIG. 8. Variation of the frequency response needs an adjustment of the threshold reference attributed to, for instance, a clock data recovery (CDR) circuit set in the downstream of the TIA 100.

Figure 9B:
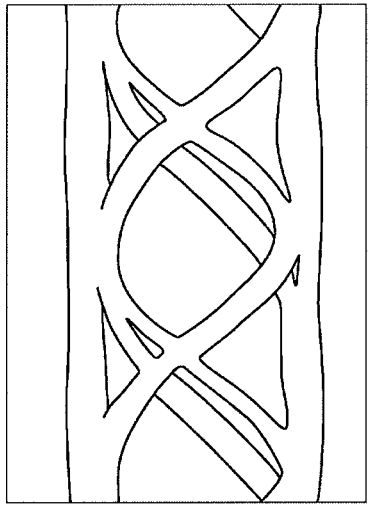
Figure 9A:
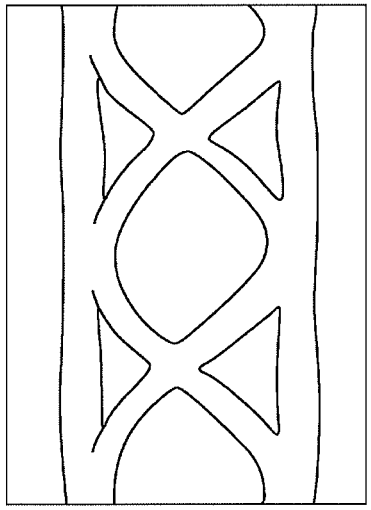

FIGS. 9A and 9B show eye-diagrams of the voltage output of the TIA 100 when the optical inputs are 0 dBm and +4 dBm, respectively. Although the eye diagram at the optical input power of 0 dBm illustrated in FIG. 9A shows a relatively neat pattern, but the eye diagram in FIG. 9B causes some jitters. Thus, the variation of the input impedance of the TIA 100, which influences the frequency bandwidth thereof, sometimes degrades the eye diagram of the voltage output Vout.

(First Embodiment)

Figure 1:
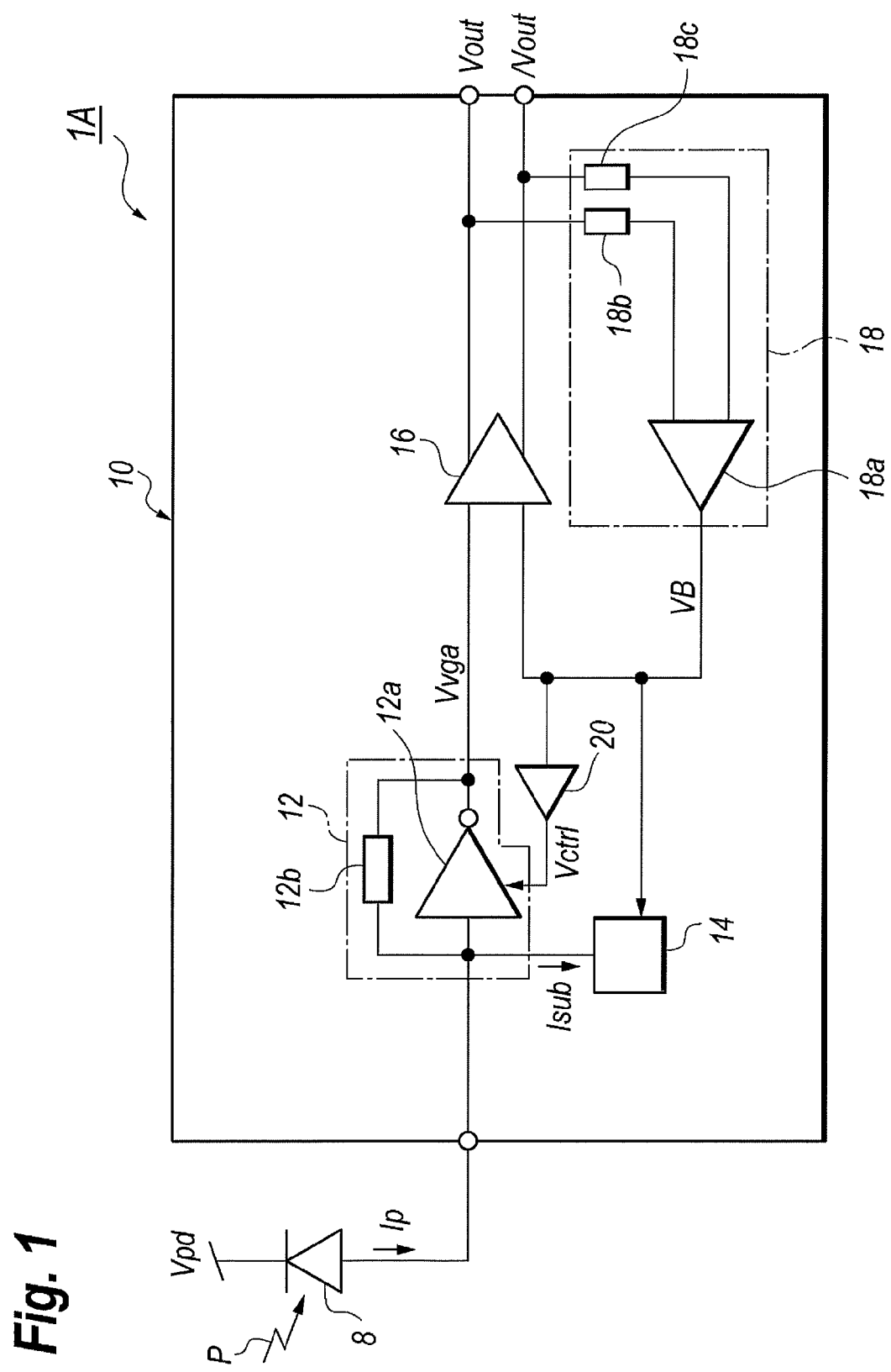
FIG. 1 shows a functional block diagram of an optical transceiver implemented with a TIA according to an embodiment of the invention.

FIG. 1 is a circuit diagram of an optical receiver implementing with a TIA according to an embodiment of the present invention. The optical receiver 1A includes a PD 8 and the TIA 10. The PD 8 is coupled with a power supply Vpd in the cathode thereof to receive a bias voltage Vpd. The PD 8 is also coupled with the TIA 10 in the anode thereof. The PD 8, as descried previously, generates a photocurrent Ip corresponding to an optical input P and provides thus generated photocurrent Ip to the TIA 10.

The TIA 10 converts the photocurrent Ip into voltage signals, Vout and /Vout, complementary to each other, where a slash "/" means that a signal denoted by a symbol subsequent to the slash has a phase opposite to a signal denoted by the symbol. The TIA 10 of the embodiment provides a variable gain amplifier 12, a current subtracter 14, a buffer amplifier 16, a feedback unit 18, and a gain controller 20.

The variable gain amplifier 12, which converts a current input therein into a voltage signal Vvga, includes an inverting amplifier 12a with a variable gain function and a feedback resistor 12b. The current input to the variable gain amplifier 12a is a current obtained by subtracting a current Isub, by the current subtracter 14, from the photocurrent Ip, namely, Ip-Isub. The feedback resistor 12b is put between the input and output of the variable gain amplifier 12a. Since the input impedance of the variable gain amplifier 12a is set so high as to make the input bias current thereof extremely small, almost all current entering the variable gain amplifier 12 flows in the feedback resistor 12b, which lowers the output Vvga of the variable gain amplifier 12. That is, as the current entering the variable gain amplifier 12 becomes large, the output Vvga thereof lowers.

The output Vvga of the variable gain amplifier 12 enters the buffer amplifier 16. The buffer amplifier 16 includes two inputs, one of which receive the output Vvga of the variable gain amplifier 12, while, the other receivers the output VB of the feedback unit 18. The buffer amplifier 16 has the arrangement of the differential amplifier to amplify a difference between two inputs, namely, Vvga-VB. The outputs of the buffer amplifier 16 are output from the TIA 10.

The current subtracter 14 subtracts the current Isub from the photocurrent Ip. Specifically, the current subtracter 14 subtracts a larger current as the output Vout becomes small. Exactly, as the voltage level of the output Vout lowers, the current subtracter 14 extracts a larger current Isub from the photocurrent Ip. In the present embodiment, the current subtracter 14 detects the voltage level of the output Vout via the control signal VB output from the feedback unit 18.

The feedback unit 18 compensates the output offset of the buffer amplifier 16 by generating the control signal VB. The feedback unit 18 of the present embodiment includes an amplifier 18a and two resistors, 18b and 18c. The amplifier 18a receives two outputs, Vout and /Vout, via respective resistors, 18b and 18c. That is, the amplifier 18a amplifies a difference between two outputs, Vout and /Vout; in other words, the feedback unit 18 generates the control signal VB such that the two outputs, Vout and /Vout, becomes substantially equal to each other.

The gain controller 20 adjusts the gain of the variable gain amplifier 12. Specifically, the gain controller 20 lowers the gain of the inverting amplifier 12a by outputting the control signal Vctrl as the output Vout lowers the voltage level thereof, which is detected via the output VB of the amplifier 18a. That is, the gain controller 20 reduces the gain of the variable gain amplifier 12 as the photocurrent Ip becomes large.

Figure 2:
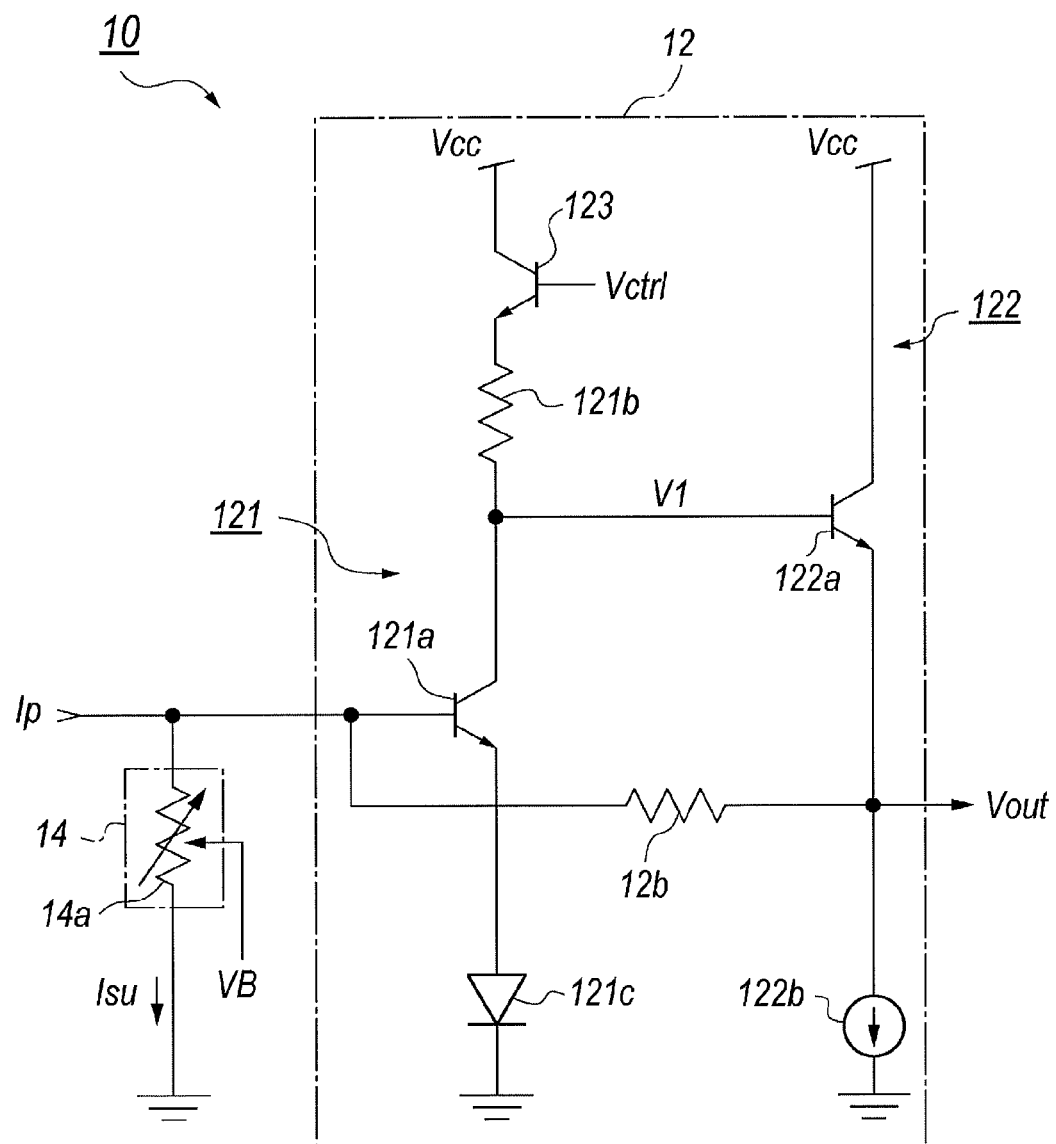
FIG. 2 is a circuit diagram of a variable gain amplifier implemented within the TIA shown in FIG. 1.

FIG. 2 is a circuit diagram of a front end of the TIA 10 shown in FIG. 1. FIG. 2 only illustrates the variable gain amplifier 12 and the current subtracter 14. The current subtracter 14 includes a variable resistor 14a whose resistance becomes small as the control signal VB becomes small, that is, the output Vout lowers the voltage level thereof, which means the photocurrent Ip becomes larger.

The variable gain amplifier 12 includes an amplifying stage 121 and an emitter follower stage 122. The amplifying stage 121 includes a series circuit of a diode 121c, an npn transistor 121a, a load resistor 121b, and another npn transistor 123 between the power supply Vcc and the ground. The npn transistor 121a, which shows an amplifying function and will be called as an amplifying transistor, receives the photocurrent Ip in the base thereof; while, the other transistor 123 receives the control signal Vctrl, which controls the gain of the amplifying stage and will be called as a gain controlling transistor. The output V1 of the amplifying stage 121 is brought from the collectors of the transistor 121a. The amplifying stage 121 lowers the output V1 thereof as the photocurrent Ip becomes large.

The emitter follower stage 122 includes a series circuit of a transistor 122a and another transistor 122b, the former transistor 122a receives the output V1 of the amplifying stage 121, while, the other transistor 122b operates as a constant current source. A node between two transistors, 122a and 122b, is the output Vout of the variable gain amplifier 12.

As already described, the variable gain amplifier 12 provides the feedback resistor 12b put between the input and output thereof. The feedback resistor 12b of the circuit in FIG. 2 is connected between the base of the transistor 121a and the output thereof. The diode connected to the emitter of the transistor 121a raises the voltage level of the output of the amplifying stage 121 to provide an enough bias to the current source 122b to stabilize the current source 122b.

The variable gain amplifier 12 shown in FIG. 2 provides the npn transistor 123 between the load resistor 121b and the power supply Vcc in the amplifying stage 121. As already described, the base of this transistor 123 receives the control signal Vctrl provided from the gain controller 20. The control signal Vctrl decreases as the voltage level of the output Vout lowers, namely, as the photocurrent Ip increases.

In the variable gain amplifier 12, the voltage level V1 of the amplifying stage 121 is primarily determined by the photocurrent, exactly, the current subtracted by the subtracted current Isub from the photocurrent Ip, the resistance of the feedback resistor 12b, and the base-emitter bias Vbe of the emitter follower transistor 122a. Specifically, almost all of the input current flows in the feedback resistor 12b, which causes a voltage drop thereat; while, the base level of the amplifying transistor 121a is substantially equal to a sum of the forward bias condition by two p-n junctions of the diode 121c and the base-emitter junction of the transistor 121a, which is nearly equal to about 1.5 V. Thus, the voltage level V1 of the output of the amplifying unit 121 is automatically set to be about Vb−$V_{RF}$+Vbe, where Vb is the base level of the amplifying transistor 121a which is equal to about 2*Vbe, $V_{RF}$ is the voltage drop by the feedback resistor 12b, and Vbe is the base-emitter bias.

When no gain controlling transistor 123 is provided, the current determined by an equation of (Vcc−V1)/$R_{LOAD}$, where $R_{LOAD}$ is the resistance of the load resistor 121b, flows in the load resistor 121b. However, inserting the gain controlling transistor 123 between the power supply Vcc and the load resistor 121b, whose emitter level is primarily determined by the base input Vctrl subtracted by the base-emitter bias substantially equal to the forward bias condition of the p-n junction, which is equal to about 0.75 V; then, the voltage caused in the load resistor 121b decreases to (Vctrl−0.75)−V1, which automatically decreases the current flowing in the load resistor 121b and the amplifying transistor 121a. Thus, the gain controlling transistor 123 varies the gain of the amplifying stage 121, resultantly, that of the inverting amplifier 12.

The embodiment shown in FIG. 2 uses bipolar transistors. However, the variable gain amplifier 12 can be realized by field-effect-transistors instead of the bipolar transistors.

Figure 3:
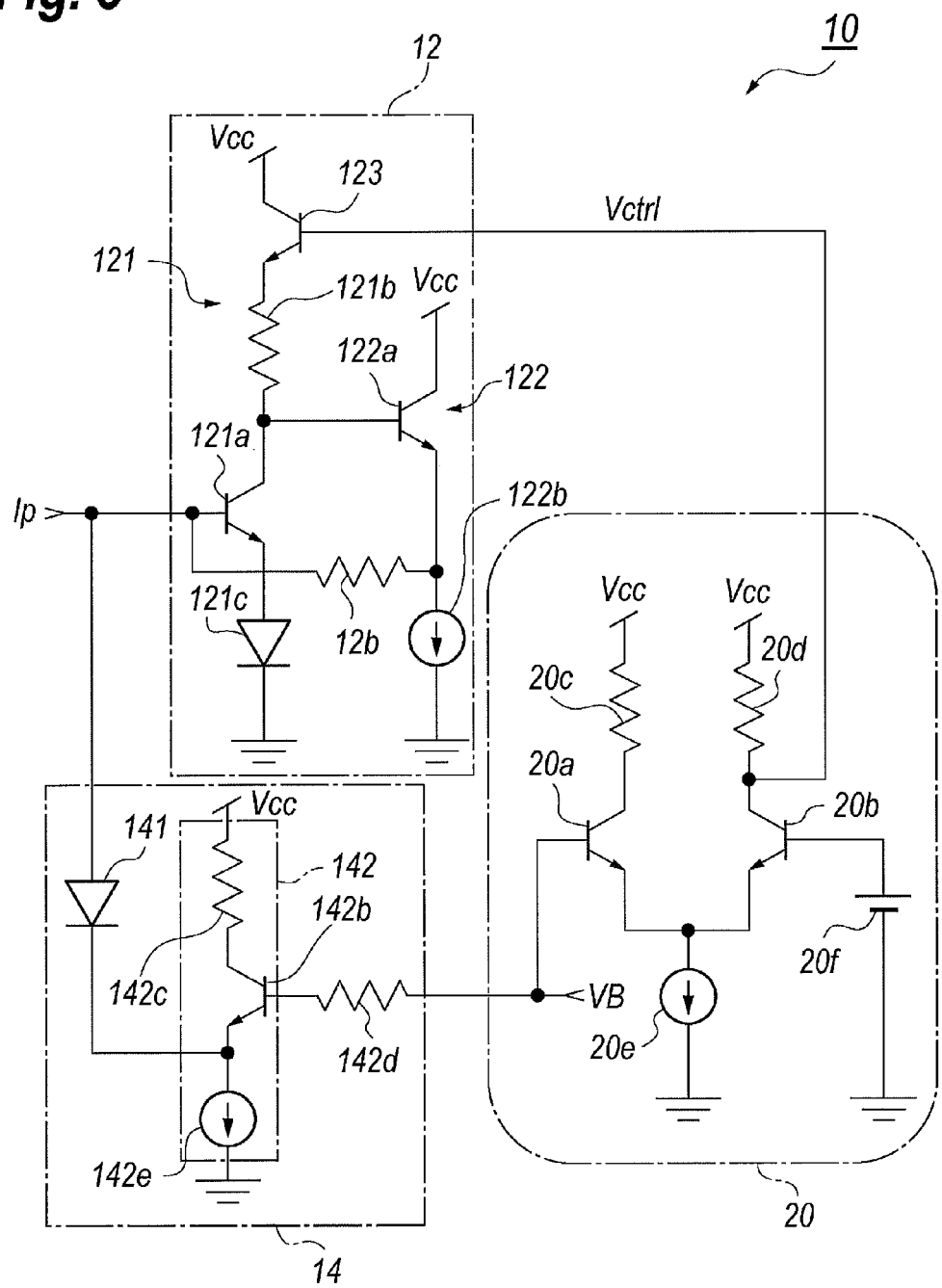
FIG. 3 is a circuit diagram of the TIA shown in FIG. 1.

FIG. 3 is an example of a practical circuit diagram of the current subtracter 14 and the gain controller 20. FIG. 3 also shows the variable gain amplifier 12 described in FIG. 2. The variable resistor 14a shown in FIG. 2 is configured by elements shown in FIG. 3. That is, the current subtracter 14 of FIG. 3 includes a diode 141 and a current adjustor 142. The diode 141 is connected in the anode thereof to the input of the variable gain amplifier 12, while, the cathode thereof is coupled with the emitter of a transistor 142b in the current adjustor 142.

The current adjustor 142 includes the transistor 142b, a resistor 142c and a constant current source 142e, where they are connected in series between the power supply Vcc and the ground. The base of the transistor 142b receives the output VB of the feedback unit 18. In the current subtracter 14, when the photocurrent Ip is small enough, which sets the control signal VB high enough and the transistor 142b in the current adjustor 142 fully turns on to supply the current to the current source 142e only by the transistor 142b; accordingly, the current flowing in the diode 141 becomes substantially zero, that is, substantially no current is subtracted from the photocurrent Ip.

Increasing the photocurrent Ip, which lowers the control signal VB and the transistor 142b in the base-emitter bias becomes smaller; the current flowing in the transistor 142b becomes lesser. However, the constant current source 142e generates the constant current. Then, the current flowing in the diode 141 compensates the shortage of the current flowing in the transistor 142b. Thus, the subtracted current Isub increases to compensate the increase of the photocurrent and prevents the variable gain amplifier from saturation.

The gain controller 20, which has an arrangement of the differential amplifier, includes a pair of transistors, 20a and 20b, a pair of load resistors, 20c and 20d, a constant current source 20e, and a reference 20f. The control signal VB is provided to the base of one of the paired transistor 20a, while, the output Vctrl is brought from the collector of the other of the paired transistor 20b. Thus, the arrangement of the gain controller 20 shown in FIG. 3 is the non-inverting amplifier, that is, the output Vctrl thereof has the phase same as that of the control signal VB.

When the control signal VB in the voltage level thereof is high, which corresponds to a status where the photocurrent Ip is small, the output Vctrl thereof also increases the voltage level thereof. On the other hand, when the photocurrent Ip becomes large, the control signal VB in the voltage level thereof lowers and the output Vctrl also lowers, which reduces the voltage gain of the amplifying stage 121 in the variable gain amplifier 12 as already described. The voltage gain of the gain controller 20 is set relatively smaller, several fold at most.

The operation of the optical receiver 1A, or the TIA 10 will be described. The input impedance Zin of the TIA 10 is given by:

$$Zin=\{Zf/(A+1)\}//Zsub, \quad (3)$$

where Zf, A and Zsub are the impedance of the feedback resistor 12b, the gain of the variable gain amplifier 12, and the impedance of the current subtracter 14, respectively.

In the present embodiment, the gain controller 20 adjusts the gain of the variable gain amplifier 12; specifically, the gain controller 20 reduces the gain A as the photocurrent Ip, exactly, the current obtained by subtracting current Isub from the photocurrent Ip, increases. On the other hand, the subtracted current Isub increases as the photocurrent Ip increases, which means that the resistance/impedance of the current subtracter 14 reduces as the photocurrent Ip increases. As the photocurrent increases, the resistance/impedance of the current subtracter 14 reduces, but the equivalent impedance of the variable gain amplifier 12, which is given by Zf/(A+1), increases because the gain A reduces. Accordingly, the reduction of the resistance/impedance of the current subtracter 14 is compensated by the decrease of the gain A. Thus, the TIA 10, or the optical receiver 1A implementing with the TIA 10 suppresses the variation of the frequency bandwidth and the jitter depending on the optical input power, namely, the photocurrent.

The resistance/impedance of the current subtracter 14 varies nonlinearly because the current subtracter 14 includes the current adjuster 142 with the bipolar transistor 142b to vary the subtracted current Isub. A bipolar transistor in the collector current, or the emitter current, thereof shows a nonlinear dependence on the base input. Because the subtracted current Isub is defined by a difference between the constant current of the current source and the emitter current of the transistor 142b, the subtracted current Isub shows the nonlinear dependence on the base input.

On the other hand, the TIA 10 of the present embodiment varies the gain of the amplifying stage 121 also by the transistor 123, and the base input thereof is derived from the control signal VB output from the feedback unit 18, same as that of the current adjustor 142. Accordingly, the increase of the subtracted current Isub and the decrease of the voltage gain A of the inverting amplifier 12 behave substantially same to each other. Thus, the variation of the input impedance Zin of the TIA 10 is restricted.

Figure 4A:
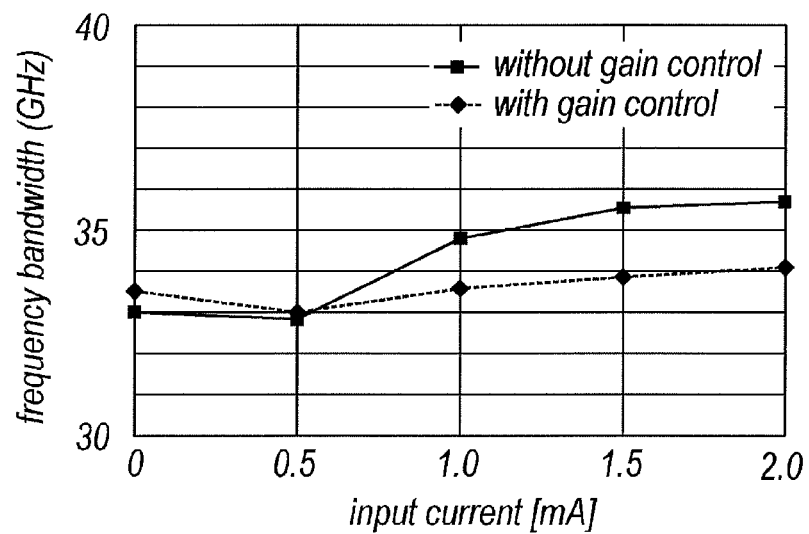
FIG. 4A shows the frequency bandwidth of the TIA shown in FIG. 1 against the input current.
Figure 4B:
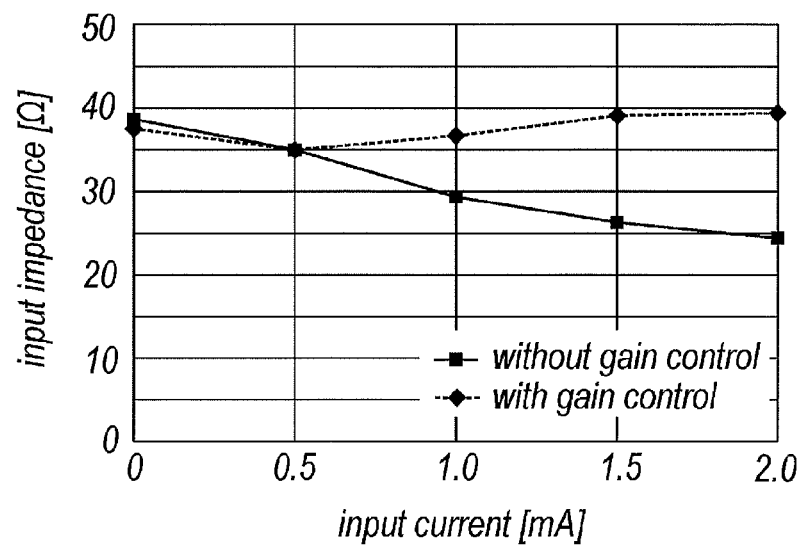
FIG. 4B shows the input impedance of the TIA against the input current.

FIGS. 4A and 4B each compare two TIAs by the frequency bandwidth in FIG. 4A and the input impedance in FIG. 4B. The frequency bandwidth of the TIA 100 without the gain control narrows by about 3 GHz as the photocurrent increases from 0 mA to 2 mA. On the other hand, the TIA 10 with the gain control suppresses the decrease in the frequency bandwidth only to about 1 GHz. Also, the input impedance of the TIA 100 without the gain control varies almost 15Ω, while, that of the TIA 10 with the gain control changes the input impedance only about 5Ω for the change of the photocurrent of 2 mA. Thus, the function of the gain control in the inverting amplifier 12, or the TIA 10 is effective against the gradation in the performances of a TIA.

(Second Embodiment)

Figure 5:
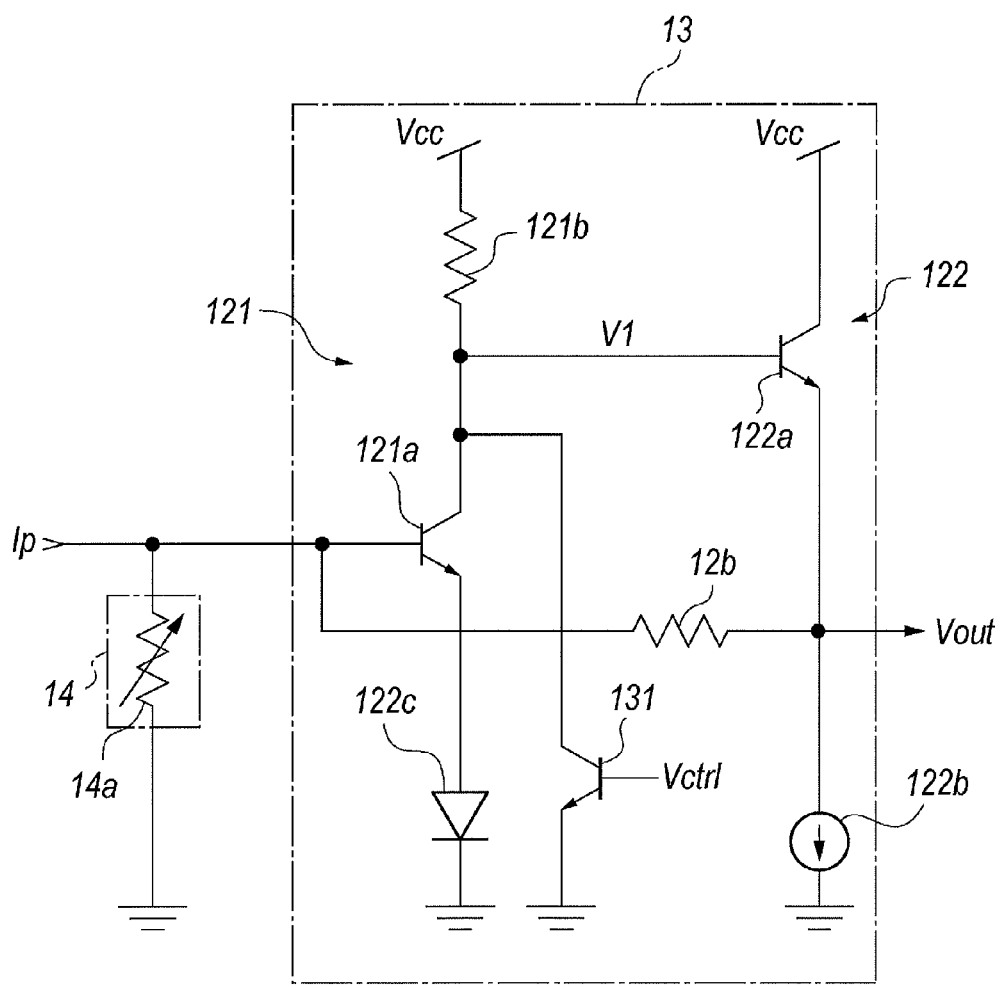
FIG. 5 is a circuit diagram of another variable gain amplifier according to the second embodiment of the invention.

FIG. 5 shows a circuit diagram of another TIA 11 according to the second embodiment of the invention. FIG. 5 omits the gain control 20. The TIA 11 shown in FIG. 5 has a feature distinguishable from the TIA 10 of the first embodiment that the variable gain amplifier 11 of the present embodiment provides, instead of the gain controlling transistor 123, a transistor 131 connected in parallel to the amplifying transistor 121*a*.

The gain controlling transistor 131 of the present embodiment receives the control signal Vctrl in the base thereof. However, different from that of the aforementioned embodiment, the gain A of the inverting amplifier 13 reduces as the control signal Vctrl increases. The gain controlling transistor 131 shunts the current flowing in the load resistor 121*b*. On the other hand, the output voltage level V1 is primarily determined by the current input to the inverting amplifier; exactly, the photocurrent Ip reduced by the subtracted current Isub. That is, almost all of the input current above flows in the feedback resistor 12*b*, which causes a voltage there. Thus, the DC operating point of the amplifying transistor is kept substantially constant, while, the AC load resistor is regarded as a parallel circuit of the load resistor 121*b* and the collector resister of the gain controlling transistor 131. The average current flowing in the load resistor 121*b* is substantially constant, which is the sum of the current flowing in the amplifying transistor 121*a* and that flowing in the gain controlling transistor 131. However, the former current flowing in the amplifying transistor only contributes the AC component of the current flowing in the load resistor 121*b*. Thus, the gain of the amplifying stage 121 is varied by controlling the magnitude of the gain controlling transistor 131.

Figure 6:
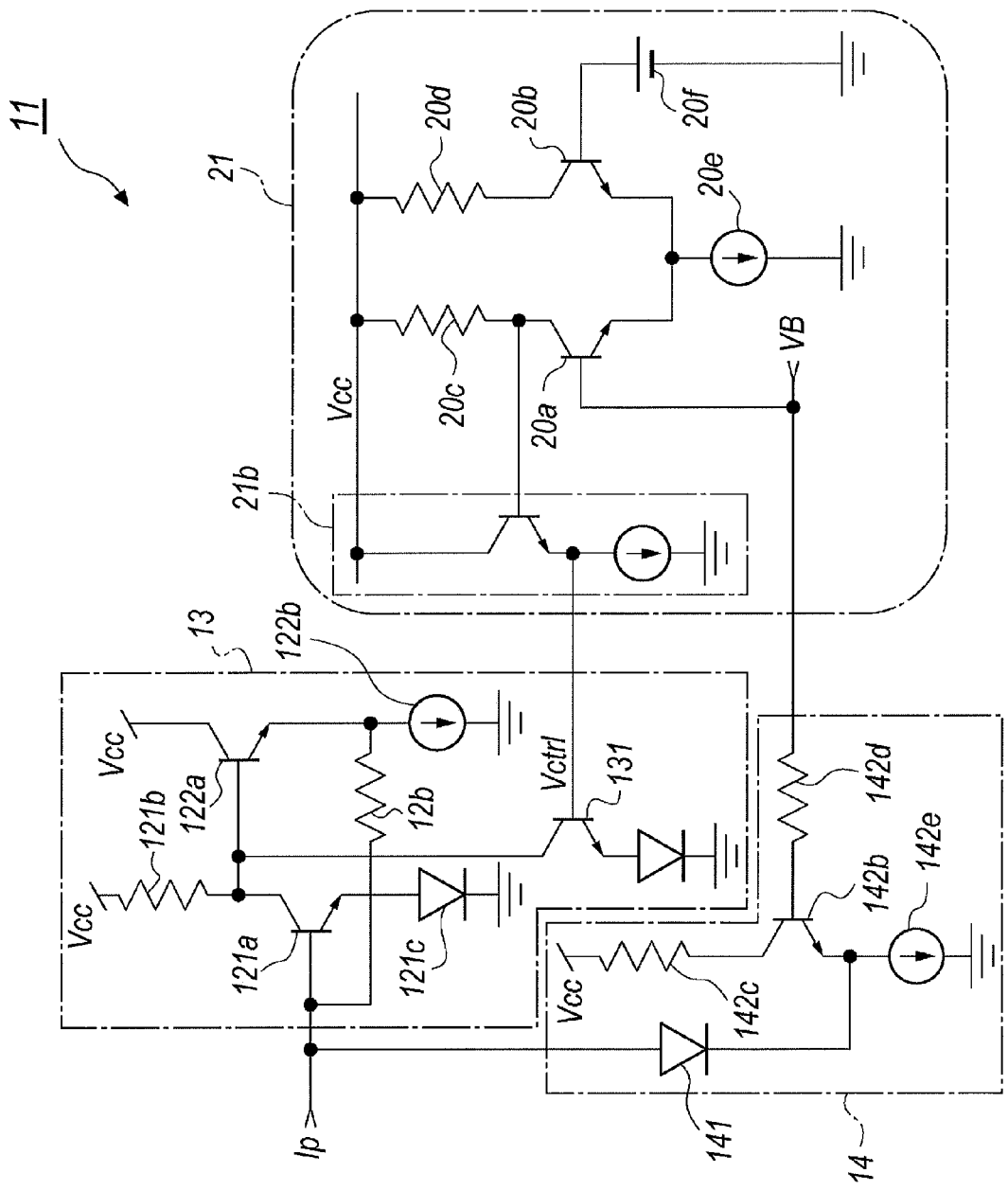
FIG. 6 is a circuit diagram of the TIA implemented with the variable gain amplifier shown in FIG. 5.

FIG. 6 shows a circuit diagram of the TIA 11 implemented with the variable gain amplifier 13 shown in FIG. 5. The TIA 11 provides the current subtracter 14 whose configuration is the same as that aforementioned.

The gain control unit 21 of the present embodiment has the differential arrangement same as those shown in FIG. 3. However, the output Vctrl of the present gain control unit 21 has a phase opposite to the input VB. That is, the output VB is pulled out from the collector of one of the paired transistor 20*a* that receives the output VB of the feedback unit instead of the other transistor 20*b* in the aforementioned control unit 20. The control signal Vctrl is provided through the emitter follower 21*b* to shift the DC voltage level thereof.

When the output VB of the feedback unit 20 raises the voltage level thereof, which corresponds to a state where the photocurrent Ip becomes small, the transistor 20*a* flows relatively larger current, which drops the collector level and the output Vctrl of the control unit 21. Then, the gain controlling transistor 131 in the variable amplifier 13 reduces the current flowing therein, which enhances the gain of the variable gain amplifier 13. On the other hand, when the photocurrent becomes large, which lowers the voltage level of the output VB of the feedback unit 20, the control signal Vctrl raises the voltage level thereof and the current flowing in the gain controlling transistor 131 increases and the other current flowing in the amplifying transistor 121*a* decreases. Thus, the gain of the variable gain amplifier 13 reduces.

According to the variable gain amplifier 13 of the present embodiment, the gain A thereof varies depending on the magnitude of the photocurrent Ip, specifically, the larger the photocurrent Ip, the lower the gain A of the variable gain amplifier 13. Then, the variation of the input impedance Zin of the amplifier 13 is suppressed even the current subtracter 14 varies the resistance/impedance thereof depending on the photocurrent Ip.

Moreover, the gain of the variable gain amplifier 13 is varied by the gain controlling transistor 131 similar to the aforementioned embodiment. Accordingly, even the resistance/impedance of the current subtracter 14 varies nonlinearly by the transistor 142*b*, the variation of the input impedance Zin of the variable gain amplifier 13 is suppressed because the gain of the amplifier 13 is varied also by the bipolar transistor 131.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A trans-impedance amplifier configured to convert a portion of a photocurrent into an output voltage, comprising:
    a current subtracter configured to generate a subtraction current; and
    a variable gain amplifier with a feedback resistor connected between an input and an output of the variable gain amplifier, the variable gain amplifier converting a current obtained by subtracting the subtraction current from the photocurrent into the output voltage,
    wherein the subtraction current nonlinearly depends on a magnitude of the output voltage, and the variable gain amplifier nonlinearly varies a voltage gain thereof.

2. The trans-impedance amplifier of claim 1,
    wherein the current subtracter provides a diode and a current adjuster including a resistor, a transistor and a constant current source connected in series between a power supply and a ground, the transistor being controlled by a signal reflecting the magnitude of the voltage output, and
    wherein the constant current source generates a current which is a sum of a current flowing in the transistor and another current flowing in the diode.

3. The trans-impedance amplifier of claim 1,
    wherein the variable gain amplifier includes an amplifying stage and an emitter follower stage connected downstream of the amplifying stage, the amplifying stage including a gain controlling transistor, a load resistor, an amplifying transistor, and a diode connected in series between a power supply and a ground, and
    wherein the gain controlling transistor receives a control signal reflecting the magnitude of the voltage output.

4. The trans-impedance amplifier of claim 3,
    further including a control unit configured to generate a control signal provided to the gain controlling transistor, the control signal reflecting the magnitude of the voltage output with a phase equal to the voltage output.

5. The trans-impedance amplifier of claim 1,
    wherein the variable gain amplifier includes an amplifying stage and an emitter follower stage connected downstream of the amplifying stage, the amplifying stage including a gain controlling transistor, a load resistor, an amplifying transistor and a diode, wherein the load resistor, the amplifying transistor and the diode are connected in series between the power supply and the ground, and wherein the gain controlling transistor shunts a current flowing in the load resistor to decrease another current flowing in the amplifying transistor.

6. The trans-impedance amplifier of claim 5, wherein the gain controlling transistor is driven by a control signal with a phase opposite to a phase of the voltage output.

* * * * *